United States Patent [19]

Yamada et al.

[11] Patent Number: 5,650,019
[45] Date of Patent: Jul. 22, 1997

[54] SOLAR CELL MODULE HAVING A SURFACE COATING MATERIAL OF THREE-LAYERED STRUCTURE

[75] Inventors: Satoru Yamada, Tsuzuki-gun; Takahiro Mori, Ikoma; Ichiro Kataoka, Tsuzuki-gun; Shigenori Itoyama, Nara, all of Japan

[73] Assignee: Canon Kabushiki Kaisha, Tokyo, Japan

[21] Appl. No.: 446,788

[22] PCT Filed: Sep. 30, 1994

[86] PCT No.: PCT/JP94/01639

§ 371 Date: May 30, 1995

§ 102(e) Date: May 30, 1995

[87] PCT Pub. No.: WO95/09442

PCT Pub. Date: Apr. 6, 1995

[30] Foreign Application Priority Data

Sep. 30, 1993 [JP] Japan ................................. 5-244170
Sep. 30, 1994 [JP] Japan ................................. 6-236970

[51] Int. Cl.[6] .................................................... H01L 31/048
[52] U.S. Cl. ........................... 136/251; 136/259; 257/433
[58] Field of Search ................................. 136/251, 259; 257/433, 787–790, 795

[56] References Cited

U.S. PATENT DOCUMENTS 5,474,620  12/1995  Nath et al. .......................... 136/251
5,482,571  1/1996  Yamada et al. ..................... 136/259

FOREIGN PATENT DOCUMENTS

| 57-1263 | 1/1982 | Japan | 136/251 |
| 57-143872 | 9/1982 | Japan | 136/251 |
| 58-83164 | 6/1983 | Japan | 136/251 |
| 59-163881 | 1/1984 | Japan | 136/251 |
| 61-49482 | 3/1986 | Japan | 136/251 |
| 5-235393 | 9/1993 | Japan | 136/251 |

*Primary Examiner*—Aaron Weisstuch
*Attorney, Agent, or Firm*—Fitzpatrick, Cella, Harper & Scinto

[57] ABSTRACT

A solar cell module comprising a photovoltaic element (solar cell) enclosed by a filler material and a coating material having a three-layered structure which is disposed on the light receiving side of the photovoltaic element, wherein said coating element includes a hard resin layer having a hardness of at least 50 in Shore hardness D; and adhesive layer having the functions of absorbing ultraviolet rays of wavelengths which deteriorate said hard resin layer and of transmitting ultraviolet rays necessary for electrical power generation by the photovoltaic element, and also having an adhesive function; and an outermost layer of excellent weatherability (the resin itself having excellent stability against heat, light, and moisture, the hard resin layer, adhesive layer, and outermost layer being laminated in this order on the filler material covering the light receiving surface of the photovoltaic element.

30 Claims, 6 Drawing Sheets

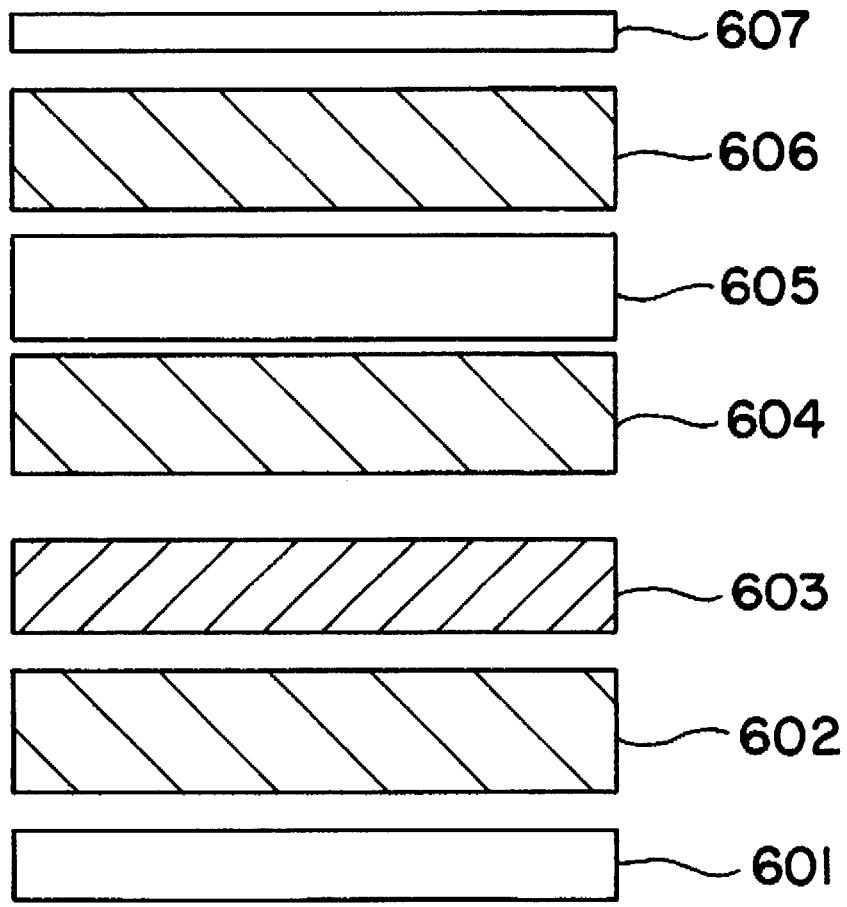

SOLAR CELL MODULE HAVING A SURFACE COATING MATERIAL OF THREE-LAYERED STRUCTURE

BACKGROUND OF THE INVENTION

1. Field of the Invention

The present invention relates to a solar cell module which excels in weatherability, heat resistance, moisture resistance, scratch resistance, and has an excellent protective ability against external pressure. More particularly, the present invention relates to a solar cell module comprising a photovoltaic element (that is, a solar cell) enclosed by a filler material and a coating material having a three-layered structure which is disposed on the light receiving surface of the solar cell, wherein said coating material is composed of a layer made of hard resin having a hardness of 50 or more in Shore hardness D (hereinafter, referred to as a hard resin layer); a layer having a function of absorbing ultraviolet rays liable to deteriorate the hard resin layer and capable of transmitting light necessary for photoelectric conversion of the solar cell and also having an adhesive function (hereinafter, referred to as an adhesive layer); and a layer made of a resin excellent in weatherability (the resin itself being stable against heat, light, and moisture; hereinafter, referred to as an outermost layer), said hard resin layer, adhesive layer, and outermost layer being laminated on the light receiving surface side of the photovoltaic element in this order from the light receiving surface side. The coating material having the above-described three-layered structure in the solar cell module of the present invention prevents damage to the photovoltaic element when applied with external pressure, and provides the weatherability, heat resistance, moisture resistance, and scratch resistance necessary for the solar cell module.

2. Related Background Art

Recently, a number of thin film solar cells have been proposed. A typical one of these thin film solar cells is an amorphous silicon (a-Si) thin film solar cell. As for the a-Si thin film solar cell, there is known a type in which an a-Si semiconductor film functioning as a photoelectric conversion element is provided on a conductive substrate and a transparent conductive layer is provided on the semiconductor thin film. In the case where the a-Si thin film solar cell having the above construction is used as a power supply means, the surface of the a-Si solar cell on the light incident side must be protected, unlike a solar cell having a construction using a glass sheet as the substrate. For this purpose, a protective means is provided on the surface of the a-Si solar cell on the light incident side. It is most important for the protective means to sufficiently transmit sunlight in order to maintain the conversion efficiency of the solar cell. The protective means is also required to protect the interior of the solar cell against wind and rain and the other external influences (hereinafter, referred to as interior protective ability). It is also important that the protective means itself be prevented from being deteriorated, discolored, and reduced in mechanical strength due to light, heat, and moisture. As such a protective means, there is known a type in which a transparent resin layer of excellent weatherability is provided on the light receiving surface side as a surface coating layer, and a filler material made of thermoplastic transparent resin is provided below the transparent resin layer. The resin layer as the surface coating layer is generally composed of an acrylic resin film or a fluororesin film such as a tetrafluoroethylene-ethylene copolymer film or polyvinyl fluoride film. As described above, a filler material is interposed between the surface coating layer and the solar cell. As the filler material, there is generally used EVA (ethylene-vinyl acetate copolymer), butyral resin, or the like. A back surface film is provided on the back surface of the conductive substrate of the solar cell by means of a filler material. As the back surface film, there is used a nylon film, a fluororesin laminated aluminum film, or the like. Moreover, in a practical solar cell module, a reinforcing material is provided on the back surface of the back surface film by means of a filler material. Hence, each of the filler materials interposed between the surface coating layer and the solar cell and between the conductive substrate and the back surface film must function as an adhesive and while protecting the photovoltaic element from scratch damage and exterior impacts.

The interior protective ability of the protective means having the above construction, however, is dependent on the thickness of the coating material composed of the surface coating layer on the light receiving surface and the filler material. Specifically, as the thickness of the coating material is increased, the interior protective ability is increased; and as it is decreased, the interior protective ability is reduced. However, when the thickness of the surface coating layer on the light receiving surface side is increased, separation tends to occur at the interface between the surface coating layer and the filler material due to temperature change. The separation causes a problem in that moisture reaches the solar cell through the separated portion, and thereby not only the characteristics of the solar cell are reduced but also a leakage current is generated due to permeation of moisture. The filler material which encloses the solar cell must fill the irregularities of the solar cell and adhere to the surface coating layer. The filler material is thus required to have a rubber elasticity.

Moreover, as the thickness of the surface coating material is increased, the light transmissivity thereof is reduced, which lowers the conversion efficiency of the solar cell. The solar cell module having the above construction is generally manufactured in the following procedure. Namely, a resin film as the front surface coating layer on the light receiving surface side, a front surface filler material, a solar cell, a back surface filler material, and a back surface film are laminated, and then hot-pressed using a vacuum laminator. In this manufacturing method, since the end portions of the solar cell module come into close-contact upon hot-pressing, air sometimes remains in part of the interior between the filler material and the surface coating material on the light receiving surface side and between the filler material and the solar cell. As a result, bubbles often remain in the sealed solar cell module. The bubbles thus remaining in the solar cell module are repeatedly expanded and contracted due to temperature changes, thus leading to the separation of the coating material. The thus generated separation causes the above-described problem that moisture reaches the solar cell through the separated portion, whereby the conversion efficiency is reduced. Moreover, the remaining bubbles deteriorate the appearance of the solar cell module, thereby reducing the yield of products.

As a means for solving the above-described problem, there is known a method of inserting unwoven glass fiber fabric between the filler material and the surface coating layer on the light receiving surface side and between the filler material and the solar cell, and then laminating them. In this method, the surface coating material is reinforced by glass fibers, and it is thus improved in its mechanical strength. The interior protective ability of the surface coating material against an external force is increased because of the increased mechanical strength, and thereby the thickness of the surface coating material can be reduced. This makes it possible to prevent the above separation which more readily occurs when the thickness of the surface coating layer on the light receiving surface side is large. Moreover, since the thickness of the surface coating material can be relatively thin, the reduction in the light transmissivity of the surface coating material the reduction in the conversion efficiency of the solar cell are suppressed.

In the manufacturing process of the solar cell module, since glass fibers are interposed between the filler material and the solar cell and between the solar cell and the surface coating layer on the light receiving surface side, even when the solar cell module is pressed, air vent passages can be ensured at the end portion of the solar cell module, thereby facilitating evacuation and elimination of the remaining bubbles.

In this case, however, the glass fibers are inevitably exposed at the end portion of the solar cell module, and thereby moisture easily permeates into the solar cell module by way of the glass fibers, the permeating moisture sometimes exerting adverse effects on the solar cell. To prevent the glass fibers from being exposed at the end portion of the solar cell module, there may be considered a method of previously cutting the glass fibers into sizes smaller than that of the solar cell module; however, in this case, the end portion of the solar cell module would lack air vent passages similarly to the structure with no glass fibers, thereby generating the bubbles. This method, therefore, fails to sufficiently solve the above-described problem.

SUMMARY OF THE INVENTION

The present inventors have experimentally examined the problems of the above-described coating materials of the prior art solar cell modules, and have found that the above-described problems of the prior art solar cell module can be solved without glass fibers as in the prior art, by means of a method wherein a photovoltaic element (solar cell) is enclosed by a filler material and a surface coating material having a multi-layer structure containing a hard resin layer is disposed on the light receiving surface side of the photovoltaic element.

The present invention has been accomplished on the basis of the above-described knowledge.

A principal object of the present invention is to provide an improved solar cell module having a surface coating material satisfying the requirements for a solar cell module without glass fibers as used in the prior art, thereby solving the above-described problems of the prior art solar cell modules.

Another object of the present invention is to provide a solar cell module having a surface coating material which excels in weatherability, heat resistance, and adhesion to a photovoltaic element (solar cell), and which has the functions of protecting the photovoltaic element (solar cell) from an exteriorly applied force (external pressure) and of keeping the deterioration of the photovoltaic element (solar cell) due to moisture permeation at a minimum, thereby achieving a desired conversion efficiency for a long period of time.

A further object of the present invention is to provide an improved solar cell module comprising a photovoltaic element (solar cell) enclosed by a filler material and coating material having a three-layered structure disposed on the filler material on the light receiving surface side of the photovoltaic element, wherein said coating material includes a hard resin layer having a hardness of at least 50 in Shore hardness D; an adhesive layer having a function of absorbing ultraviolet rays with wavelengths which cause deterioration of the hard resin layer and of transmitting ultraviolet rays necessary for power generation by the photovoltaic element, and also having an adhesive function; and an outermost layer of excellent weatherability (the hard resin layer itself having excellent stability against heat, light, and moisture), said hard resin layer, adhesive layer, and outermost layer being laminated on the filler material on the light receiving side of the photovoltaic element in this order, whereby even when an external force (external pressure) is applied, the photovoltaic element is stabilized and the surface coating material is excellent in weatherability, heat resistance, and moisture resistance, without occurrence of any separation; and the photovoltaic element is prevented from being deteriorated even upon outdoors use for a long period of time, thus achieving a desired photoelectric conversion efficiency.

BRIEF DESCRIPTION OF THE DRAWINGS

FIG. 6 is a view showing the component members of another example of a prior art solar cell module.

DESCRIPTION OF THE INVENTION AND PREFERRED EMBODIMENTS

The present invention solves the above-described problems in the prior art solar cell modules and achieves the above-described objects. A solar cell module of the present invention has the following construction. Namely, the solar cell module comprises a photovoltaic element (solar cell) enclosed by a filler material and an overlying coating material having a three-layered structure disposed on the light receiving surface side of the photovoltaic element, wherein said coating element includes a hard resin layer having a hardness of at least 50 in Shore hardness D; an adhesive layer having the functions of absorbing ultraviolet rays with wavelengths which cause deterioration of the hard resin layer and of transmitting ultraviolet rays necessary for power generation by the photovoltaic element, and also having an adhesive function; and an outermost layer having excellent weatherability (the hard resin layer itself having excellent stability against heat, light, and moisture), said hard resin layer, adhesive layer and outermost layer being laminated in this order. The coating material having the above-described three-layered structure in the solar cell module of the present invention provides the following functions: (1) prevents the photovoltaic element from being damaged due to an externally applied pressure and hence to protect the solar cell; (2) weatherability, heat resistance, moisture resistance, and scratch resistance necessary for the solar cell module; (3) ensures adhesion with the photovoltaic element (solar cell); (4) minimizes deterioration of the photovoltaic element (solar cell) due to moisture permeation; and (5) provides a desired conversion efficiency of the photovoltaic element for a long period of time.

The solar cell module having the above construction according to the present invention will now be described in detail.

Figure 1:
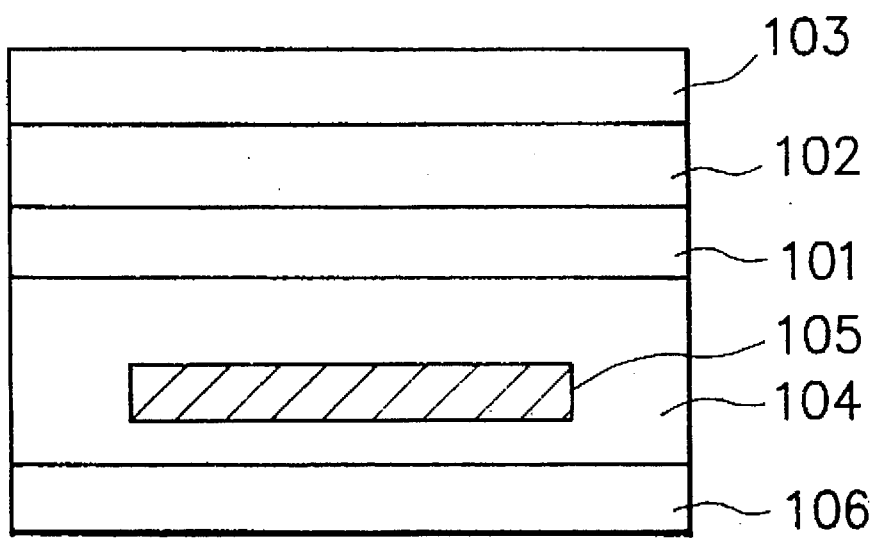
FIG. 1 is a schematic cross-sectional view of an example of a solar cell module of the present invention.

FIG. 1 is a schematic cross-sectional view of a solar cell module of the present invention. In FIG. 1, reference numeral 101 indicates a hard resin layer; 102 is an adhesive layer; 103 is an outermost layer; 104 is a filler material layer; 105 is a photovoltaic element; and 106 is a back surface insulating layer. In the solar cell module shown in FIG. 1, sunlight is impinged through the outermost layer 103, passes through the adhesive layer 102, hard resin layer 101, and filler material layer 104, and reaches the photovoltaic element 105. Electromotive force is generated by the photovoltaic element 105.

Each component of the solar cell module of the present invention will be described below.

Hard Resin Layer

The hard resin layer 101 is made of a resin having a hardness of 50 or more in Shore hardness D. The hard resin layer 101 is required to be excellent in transparency and to exhibit a strong resistance against external pressure and the like. The hard resin layer is made of high density polyethylene (at least 60 in Shore hardness D), polycarbonate (at least 70 in Shore hardness D), polyethylene terephthalate, i.e. a polyester resin (at least 80 in Shore hardness D), polyarylate (at least 70 in Shore hardness D) or polyamide resin (at least 70 in Shore hardness D). Specific examples of these resins preferably include polycarbonate, polyethylene terephthalate as a polyester resin, and polyarylate. Each of these resins is preferably used in the form of a film. Of these resins, the polycarbonate film is very high in mechanical strength, is poor in weatherability but is difficult to be discolored or reduced in mechanical strength when shielded from ultraviolet rays by the adhesive layer, with the result that it can be practically used. In the case of polyethylene terephthalate, the biaxial orientated film thereof is preferable because it is very high in mechanical strength and is not torn and pierced by pressure applied from the exterior. The polyarylate resin film has a very high heat resisting temperature and thereby it sufficiently withstands operation at a high temperature. To maintain the mechanical strength without reduction in transmission, the thickness of the hard resin layer 101 is preferably in the range of from 25 to 200 μm, more preferably, in the range of from 75 to 125 μm.

Incidentally, in the hard resin films used for the prior art solar cell modules, a type is known which contains an ultraviolet absorbent for improving the weatherability. However, the layer formed of such a hard film absorbs light having a wavelength less than about 400 nm, thus reducing the conversion efficiency of the photovoltaic element. In the present invention, therefore, such a hard film is not used.

The above-described hard resin film used as the hard resin layer 101 is preferably subjected to corona discharge treatment, ozonation, or primer coating treatment for ensuring adhesion with the filler material 104 and the adhesive layer 102.

Adhesive Layer

The adhesive layer 102 is required to exhibit the functions of protecting the hard resin layer 101 from ultraviolet rays and of transmitting sufficient light necessary for photoelectric conversion by the photovoltaic element. Moreover, it must ensure the adhesive strength with the outermost layer 103 and the hard resin layer 101. In the case where the photovoltaic element is made of a-Si and has a plurality of photoelectric conversion layers, the wavelengths of light photoelectrically converted in the respective photoelectric conversion layers are different from each other. If light necessary for a layer which converts light having a short-wavelength into electric power is shielded by the adhesive layer 102, the current generated in the photoelectric conversion layer is reduced, thus lowering the conversion efficiency of the photovoltaic element. To prevent the reduction in the conversion efficiency of the photovoltaic element, the adhesive layer 102 is made of a specified resin film having a total light transmission which is preferably at least 90% for light having a wavelength of 400 nm and above, at least 50% for 380 nm, and up to 10% for 350 nm and below; more preferably, at least 95% for 400 nm and above, at least 80% for 380 nm, and less than 5% for 350 nm and below. To realize the required light transmission of the adhesive layer, the adhesive layer is formed of an adhesive resin which is mixed with an ultraviolet absorbent in a specified amount. Moreover, the adhesive layer 102 is required to be transparent to light used for photoelectric conversion. Specific examples of the resins which satisfy the requirements for the adhesive layer, include ethylene-vinyl acetate copolymer (EVA), polyvinyl butyral (PVB), silicon resin, and acrylic resin. In the case where the adhesive strength of the adhesive layer 102 is insufficient, the adhesive strength can be enhanced by using a silane coupling agent or a titanate coupling agent. The above adhesive resin constituting the adhesive layer 102 preferably contains an ultraviolet absorbent for providing a desired ultraviolet ray shielding function to the adhesive layer. The usable ultraviolet absorbents include organic ultraviolet absorbents and inorganic ultraviolet absorbents. As an organic ultraviolet absorbent, there may be preferably used a benzophenyl series, salicylate series, benzotriazole series, or acrylonitrile series ultraviolet absorbent. More preferably, specific examples of the organic ultraviolet absorbents include 2-hydroxy-4-methoxybenzophenone, 2-hydroxy-4-n-octoxybenzophenone, and 2-(2-hydroxy-5-t-octylphenyl)-benzotriazole. Specific preferable examples of the inorganic ultraviolet absorbents include $TiO_2$, $CeO_2$, $ZnO$, and $SnO_2$.

Outermost Layer

It is important that the outermost layer 103 be stable against heat, light, and moisture (i.e. excellent in weatherability). Moreover, it is desirable that the outermost layer prevent reduction in the efficiency of the photovoltaic element due to contamination. For this purpose, the outermost layer is desired to be excellent in water repellency. The water repellency is preferably 50° or more, more preferably, 70° or more in terms of the contact angle with water. The outermost layer 103 is formed of fluororesin or silicone resin.

In the preferred mode, the outermost layer 103 is formed of fluororesin. Specific examples of the fluororesins include tetrafluoroethylene-ethylene copolymer, trifluoroethylene chloride resin, tetrafluoroethylene-perfluoroalkyl vinylether copolymer, tetrafluoroethylene-hexafluoropropylene, fluorovinylidene, and fluorovinyl resin. The outermost layer made of such resins is preferably subjected to corona treatment, ozonation, or primer coating for ensuring strong adhesion with the adhesive layer 102.

Filler Material Layer

The filler material layer 104 is required to have adhesive strength between the back surface insulating film 106 and the photovoltaic element 105, and between the photovoltaic element 105 and the hard resin layer 101. It is essential that the filler material layer be thermoplastic for filling the irregularities on the photovoltaic element 105 and giving smoothness to the hard resin layer. The filler material layer positioned on the light incident side of the photovoltaic element 105 is required to be transparent. The filler material layer 104 is made of ethylene-vinyl acetate copolymer (EVA), polyvinyl butyral (PVB), silicone resin, epoxy resin, or acrylic resin. The filler material layer positioned on the back surface may be opaque. The resin used for the filler material layer may contain a crosslinking agent, thermal oxidation preventive agent, etc. for improving the heat resistance, and also may contain an ultraviolet absorbent or light oxidation preventive agent for improving light stability. In the case where the adhesive strength between the filler material layer and the photovoltaic element is insufficient, the adhesion can be improved by the addition of a silane coupling agent or titanate coupling agent.

Photovoltaic Element (Solar Cell)

Figure 2:
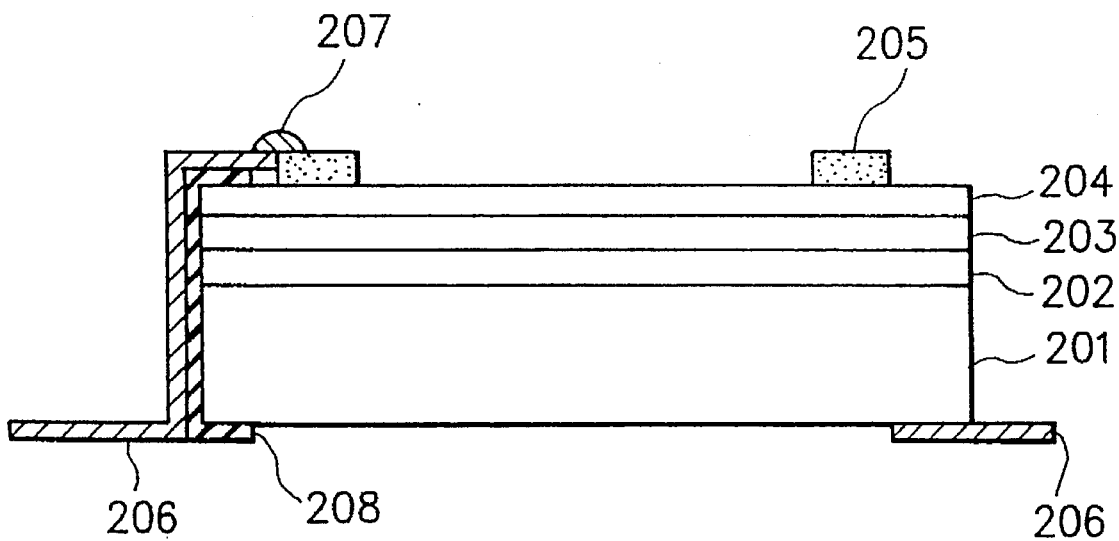
FIG. 2 is a schematic cross-sectional view of an example of a solar cell element used in the solar cell module shown in FIG. 1.
Figure 3:
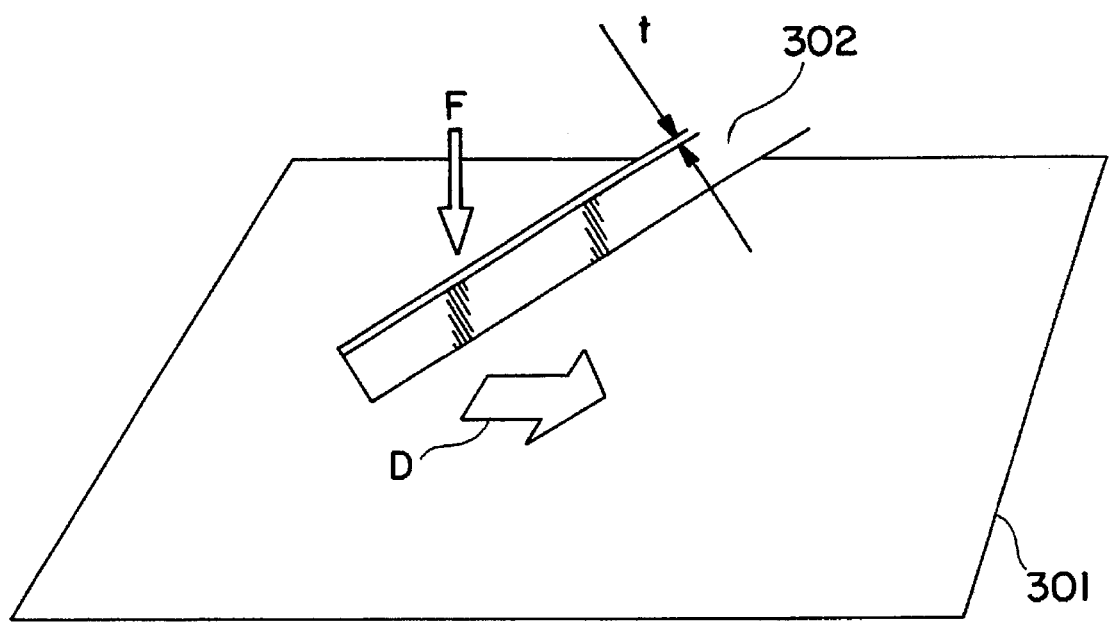
FIG. 3 is a schematic illustrative view of the scratch test procedure.

The photovoltaic element 103 of the present invention comprises a semiconductor photoactive layer as a photoelectric conversion member formed on a conductive substrate. FIG. 2 is a schematic view showing the construction of an example of the photovoltaic element. In FIG. 2, reference numeral 201 indicates a conductive substrate, 202 is a back surface reflection layer, 203 is a semiconductor photoactive layer, 204 is a transparent conductive layer, and 205 is a collecting electrode. The conductive substrate 201 functions as the base of the photovoltaic element (solar cell), and also serves as a lower electrode. The conductive substrate 201 is composed of silicon, tantalum, molybdenum, tungsten, stainless steel, aluminum, copper, titanium, carbon sheet, lead plated steel plate, or a resin or ceramic film coated with a conductive layer. On the conductive substrate 201, a metal layer, metal oxide layer, or a metal layer and metal oxide layer combination may be formed as the back surface reflection layer 202. In this case, the metal layer can be made of, for example, Ti, Cr, Mo, W, Al, Ag, or Ni. The metal oxide layer is made of, for example, ZnO, $TiO_2$, or $SnO_2$. The metal layer and the metal oxide layer can be formed by resistance heating evaporation, electron beam evaporation, or sputtering. The semiconductor photoactive layer 203 is used for photoelectric conversion, and it is made of a pn-junction polycrystalline silicon, pin-junction amorphous silicon, or of compound semiconductors such as $CuInSe_2$, GaAs, $Cds/Cu_2S$, CdS/CdTe, CdS/InP, and $CdTe/Cu_2Te$. The semiconductor photoactive layer, when composed of polycrystalline silicon, can be formed by a method in which molten silicon is molded into a sheet or amorphous silicon is heat-treated. The semiconductor photoactive layer, when composed of amorphous silicon, is formed by plasma CVD using silane gas as a raw material. The semiconductor photoactive layer, when composed of (a) compound semiconductor(s), is formed by ion plating, ion beam deposition, vacuum evaporation, sputtering, or electrodeposition. The transparent conductive layer 204 serves as an upper electrode of the photovoltaic element (solar cell). The transparent conductive layer 204 is made of, for example, $In_2O_3$, $SnO_2$, $In_2O_3$-$SnO_3$-$SnO_2$ (ITO), ZnO, $TiO_2$, $Cd_2SnO_4$, or a highly doped crystalline semiconductor layer. The transparent conductive layer 204 can be formed by resistance heating evaporation, sputtering, spraying, CVD, or impurity diffusion. A grid-like collecting electrode 205 may be provided on the transparent conductive layer 204 for effectively collecting the generated current. As specific examples of the material used for the collecting electrode 205, there may be used a conductive paste in which a fine powder of silver, gold, copper, nickel or carbon is dispersed in a binder polymer. Specific examples of the binder polymers include resins such as polyester, epoxy, acryl, alkyd, polyvinyl acetate, rubber, urethane, and phenol. In the case of using the above conductive paste, the collecting electrode is formed by a coating method. Besides this method, the collecting electrode can be formed by sputtering using a mask pattern, resistance heating, CVD, a patterning method in which a metal film is evaporated over the whole surface and unnecessary portions are removed by etching, a method of directly forming a grid electrode pattern by photo-CVD, and a method of forming a mask of a negative pattern of a grid electrode pattern, followed by plating. Output terminals 206 are mounted to the conductive substrate and the collecting electrode for outputting electromotive force. One output terminal is mounted on the conductive substrate by a method wherein a metal body such as a copper tab is joined by spot welding or soldering. The other output terminal is electrically connected to the collecting electrode electrically connected using conductive adhesive or solder 207. In mounting the output terminal 206 to the collecting electrode 205, an insulator 208 is preferably provided for preventing short-circuit due to contact between the output terminal 206 and the conductive substrate 201 and semiconductor layer 203. A plurality of photovoltaic elements (solar cells) having the above construction are connected in series or in parallel in accordance with a desired voltage or current. A plurality of the photovoltaic elements having the above construction can be integrated on an insulated substrate to obtain a desired voltage or current.

Back Surface Insulating Layer

In the case of a photovoltaic element (solar cell) having a conductive substrate, the back surface insulating layer 106 is provided to insulate the conductive substrate from the outside of the solar cell module. The back surface insulting layer 106 is formed of a film of nylon, polyethylene, polyester or polystyrene.

Hereinafter, the present invention will be described in detail with reference to examples. In addition, the present invention is not limited to the examples.

EXAMPLE 1

In this example, a solar cell module having the construction shown in FIG. 1 was prepared.

Figure 4:
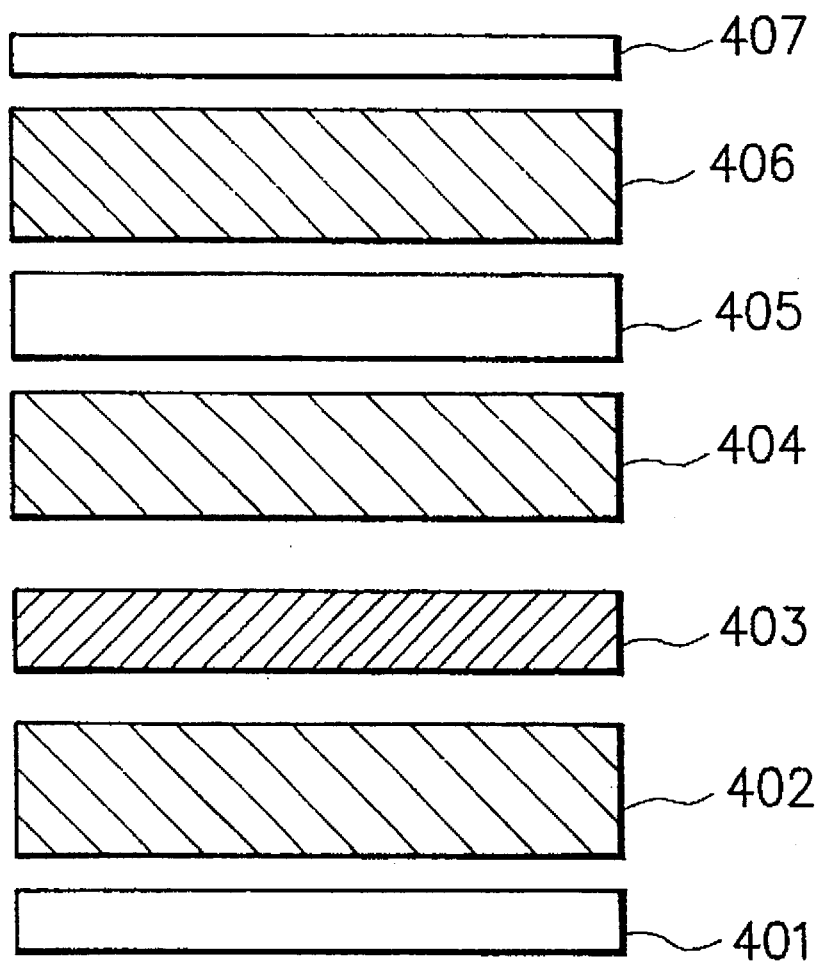
FIG. 4 is a view showing the component members of an example of a solar cell module of the present invention.

Referring to FIG. 4, there were prepared a back surface insulating layer member 401, a back surface side filler material member 402, a photovoltaic element (solar cell) 403, a front surface side filler material member 404, a hard resin layer member 405, an adhesive layer member 406, and an outermost layer member 407. These members 401 to 407 were then laminated to prepare the solar cell module of the present invention.

As the back surface insulating layer member 401, nylon (trademark name: DARTEK (thickness: 75 μm), produced by Du Pont Company) was used.

Each of the filler material layer members 402 and 404, and the adhesive layer member 406 was prepared as follows: Namely, 100 parts by weight of EVA (trademark name: EVAFLEX 150, produced by Mitsui/Du Pont Poly Chemical Company), 1.5 parts by weight of a crosslinking agent (trademark name: LUPERSOL, produced by Penwal Company), 0.3 parts by weight of a UV absorbent (trademark name: Cyasorb 531, produced by Cyanamid Company), 0.2 parts by weight of an oxidation preventive agent (trademark name: Nowguard P. produced by Uniroyal Company), and 0.1 parts by weight of a light stabilizer (trademark name: Chinubin 770, produced by Ciba Geigy Company) were mixed, and the resultant mixture was extruded by an extruder having a T die, to prepare each member in the form of a film. The thickness of the film used as the adhesive layer member 406 was 100 μm. The thickness of the film used for each of the filler material layer members 402 and 406 was 150 μm.

The photovoltaic element 403 having the construction shown in FIG. 2 was prepared as follows: Namely, a previously cleaned strip-like stainless steel substrate 201 was first prepared. On the substrate, an Al layer (thickness: 5000 Å) and a ZnO layer (thickness: 5000 Å) were sequentially formed as the back surface reflection layer 202 by sputtering. Then, a tandem type a-Si photoelectric conversion semiconductor layer 203 having a structure comprising an n-layer (film thickness 150 Å)i-layer (film thickness 4000 Å)/p-layer (film thickness 100 Å)/n-layer (film thickness 100 Å)/i-layer (film thickness 800 Å/p-layer (film thickness 100 Å) was prepared by plasma-CVD. In this case, the n-type a-Si layer was formed using a mixed gas of $SiH_4$, $PH_3$, and $H_2$; the i-type a-Si layer was formed using a mixed gas of $SiH_4$ and $H_2$, and a p-type fine crystal μc-Si layer was formed using a mixed gas of $SiH_4$, $BF_3$, and $H_2$. Next, an $In_2O_3$ thin film (thickness: 700 Å) as the transparent conductive layer 204 was formed by a method wherein In was evaporated under an $O_2$ atmosphere by resistance heating. The sample thus obtained was cut into a plurality of elements (size: 30 cm×15 cm). From the plurality of elements, two pieces were selected, each of which was formed with a collecting grid electrode 205 by screen printing using silver paste (trademark number: #5007, produced by Du Pont Company), to thus obtain a solar cell element. Two of the solar cell elements were connected in series by bonding using silver paste (trademark number: #220, produced by Kesuru Company) by way of a copper tab (thickness: 50 μm). Moreover, an output terminal from the stainless steel substrate was mounted using a copper tab (thickness: 50 μm) and silver paste (trademark number: #220 produced by Kesuru Company). Next, a polyamide resin (trademark name: Kapton film (thickness: 50 μm), produced by 3M Company) was provided on the element as the insulator 208 as shown in FIG. 2, and another output terminal was connected using a copper tab (thickness: 50 μm) and silver paste (trademark number: #220, produced by Kesuru Company). Thus, the photovoltaic elements 403 was prepared.

As the hard resin layer member 405, a polycarbonate film (trademark name: IUPILON (thickness: 100 μm, hardness: 82 in Shore hardness D, produced by Mitsubishi Gas Chemical Company) was prepared. The bonding surfaces of the polycarbonate film with the filler material and the adhesive layer were subjected to corona discharge treatment.

As the outermost resin member 407, ETFE fluororesin film (trademark name: AFLEX (thickness: 50 μm), produced by Asahi Glass Company) was prepared. The bonding surface of ETFE film with the adhesive layer was subjected to corona treatment.

On an aluminum plate (thickness: 20 mm) having a heat source, the back surface insulating layer member 401, back surface side filler material layer member 402, photovoltaic element 403, front surface side filler material member 404, hard resin layer member 405, adhesive layer member 406, and outermost member 407 were laminated in this order, to obtain a laminated body. A sheet made of heat resisting silicone rubber (thickness: 3 mm) was placed on the laminated body. Subsequently, the interior of the laminated body was evacuated to a vacuum of 10 mm Hg by a vacuum pump. In this case, an O-ring was used as a sealant. After being sufficiently evacuated, the laminated body was heated from room temperature to 150° C. and held at 150° C. for 20 min. Thus, a solar cell module was obtained. In this way, a plurality of the solar cell modules was obtained.

The solar cell modules thus obtained were evaluated by the following procedure.

Scratch Test

This test was made to examine whether the protective ability of the surface coating material of the solar cell module against scratching applied from the exterior is sufficient. In this test, a steel blade 302 was first moved along the surface of the solar cell module in the direction of the arrow D at a speed of 152.4 mm/sec while a load (F) of 4 lbs was applied. A high voltage dielectric breakdown test was performed in the following manner after the scratch test, and a standard was set such that the solar cell modules in which the generated leakage current was less than 50 μA were acceptable. The scratch test was performed on the upper outer surface of the tab type connection member located at the highest position in the solar cell module. A high voltage dielectric breakdown test next performed will be described below. The anode and cathode of the solar cell module were short-circuited after the scratch test. The sample thus obtained was dipped in a solution having an electrical conductivity of 3500 ohm-cm containing 0.1 wt % of Triton X-100 (trademark name) as a surface active agent. At this time, the scratched portion was dipped while the output terminal of the sample was not dipped in the solution. The cathode of a power source was dipped in the solution and the anode of the power source was connected to the output terminal of the sample. The evaluation was performed under the condition that a voltage of 2000 V was applied. The results obtained are shown in Table 1 in accordance with the following standard: namely, a mark ○ indicates the case where current flow was less than 0.5 μA, and a mark X indicates the case where current flow was 0.5 μA or more.

Hail Impact Test

This test is performed to examine the protective ability of the interior of a solar cell module against external pressure and impacts. This test was performed in the following procedure: Namely, ten balls of ice, each having a diameter of one inch, are made to collide with each portion of a solar cell module in which the mechanical strength is weak (the center of the photovoltaic element, corners of the module, edges, connection portion of the photovoltaic element) at a speed of 23.2 m/sec. The solar cell module thus tested was visually evaluated in terms of the presence or absence of layer separation and cracking, and in terms of photoelectric conversion efficiency. The evaluation of the photoelectric conversion efficiency was performed by a method wherein the photoelectric conversion efficiencies before and after the Hail impact test were measured, and the ratio of change therebetween was examined. The results obtained are shown in Table 1 in accordance with the following standard; namely, a mark ◎ indicates the case where layer separation and cracking are not observed at all, and the change ratio is less than 5%, a mark ○ indicates the case where a slight amount of layer separation and cracking are observed but the change ratio is less than 5%, and a mark X indicates the case where layer separation and cracking are frequently observed and the change ratio is 5% or more.

Adhesive Force in High Temperature/High Moisture

A solar cell module was held for 100 hours in the condition of 85° C./85% (relative moisture), and the adhesive strength of the solar cell module at the end portion of the coating material was qualitatively evaluated in the condition of 85° C./85% (relative moisture) by a crossing-type separation method. The results obtained are shown in Table 1 in accordance with the following standard: namely, a mark ⊙ indicates the case where the adhesive strength is excellent, a mark ○ indicates the case where the adhesive strength is sufficient to be practically used, and a mark X indicates the case where the adhesive strength is insufficient.

Weatherability

A solar cell module was subjected to an accelerated weatherability test. Specifically, the solar cell module was placed in a sunshine weather meter and was subjected to a light irradiation and raindrop cycle for 5000 hours, after which it was evaluated in terms of the appearance change and photoelectric conversion efficiency. The appearance change was visually evaluated, and the results obtained are shown in Table 1 in accordance with the following standard: namely, a mark ⊙ indicates the case where no appearance change is observed, a mark ○ indicates the case where a slight appearance change is observed but is sufficient to be practically used, and a mark X indicates the case where the appearance is insufficient to permit practical use because layer separation, cracking, and discoloring are observed.

The photoelectric conversion efficiency was evaluated by a method wherein the photoelectric conversion efficiency of the solar cell module was measured after testing, and the measured value was compared with the photoelectric conversion efficiency before testing (this was taken as 1), to obtain a relative value. Accordingly, the value shown in Table 1 is the relative value. In addition, the deterioration of the amorphous silicon photovoltaic element itself was omitted.

Durability Against Temperature Change

The solar cell module was subjected to a testing cycle (−40° C./one hour: 85° C./one hour) conducted 50 times, and the appearance of the solar cell module was visually evaluated. The results obtained are shown in Table 1 in accordance with the following standard: namely, a mark ⊙ indicates the case where no appearance change is observed, a mark ○ indicates the case where a slight appearance change is observed, a mark ○ indicates the case where a slight appearance change is observed but the module is practically usable, and a mark X indicates the case where the appearance is insufficient because layer separation, cracking, and discoloring are observed to an extent which reduces module reliability.

EXAMPLE 2

A plurality of solar cell modules were obtained by the same procedure as in Example 1, except that the resin used for the hard resin layer member 405 was replaced with a polyethylene terephthalate film (trademark name: LUMIRROR, thickness: 50 μm, hardness: 90 in Shore hardness D, produced by TORAY INDUSTRIES).

The solar cell modules thus obtained were evaluated by the same procedure as in Example 1. The results obtained are shown in Table 1.

EXAMPLE 3

A plurality of solar cell modules were obtained by the same procedure as in Example 1, except that the resin used for the hard resin layer member 405 was replaced with a polyarylate film (trademark name: EMBLATE, thickness: 100 μm, hardness: 77 in Shore hardness D, produced by UNITIKA).

The solar cell modules thus obtained were evaluated by the same procedure as in Example 1. The results obtained are shown in Table 1.

EXAMPLE 4

A plurality of solar cell modules were obtained by the same procedure as in Example 1, except that the resin used for the adhesive layer member 406 was replaced with a butyral resin.

The solar cell modules thus obtained were evaluated by the same procedure as in Example 1. The results obtained are shown in Table 1.

EXAMPLE 5

A plurality of solar cell modules were obtained by the same procedure as in Example 1, except that the resin used for the adhesive layer member 406 was replaced with methylbutyl methacrylate copolymer.

The solar cell modules thus obtained were evaluated by the same procedure as in Example 1. The results obtained are shown in Table 1.

COMPARATIVE EXAMPLE 1

Figure 5:
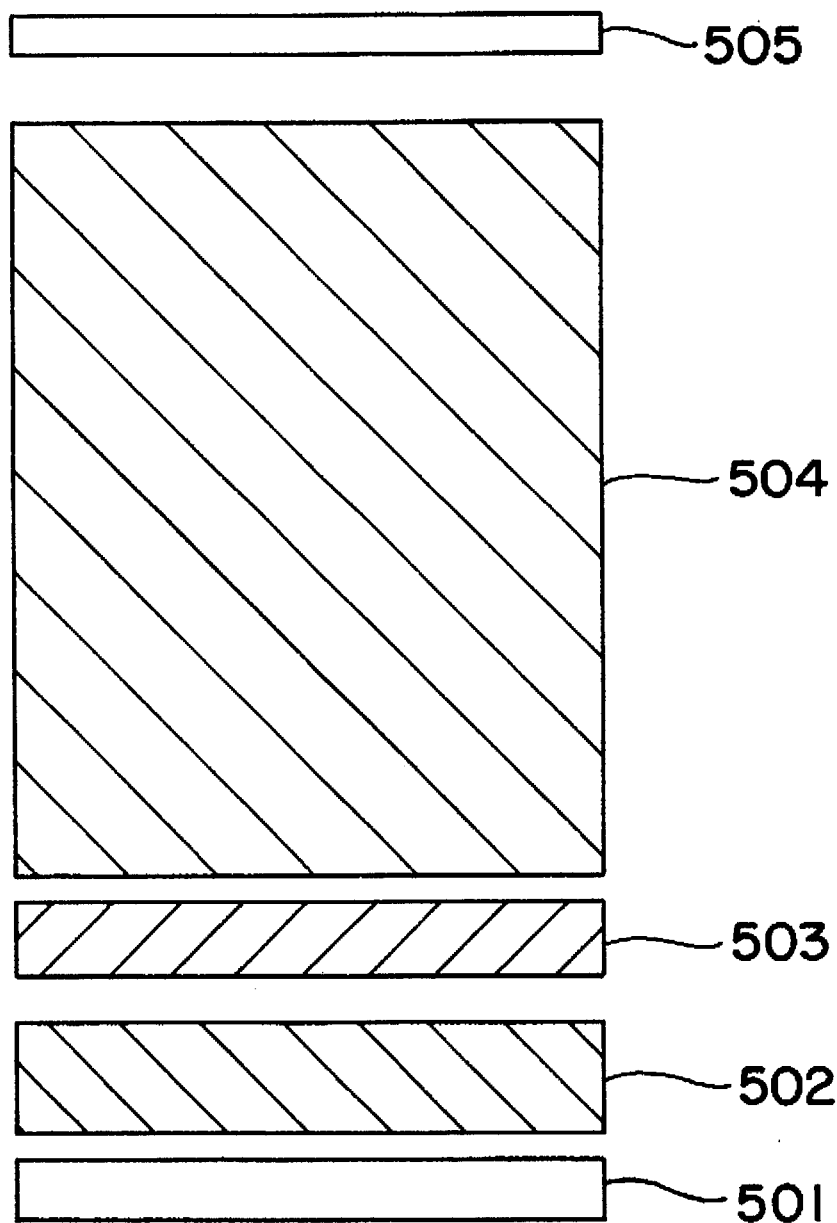
FIG. 5 is a view showing the component members of a prior art solar cell module.

First, there were prepared a back surface insulating layer member 501, a back surface side filler material member 502, a photovoltaic element (solar cell) 503, a front surface side filler material member 504 and an outermost layer member 505. These members were then laminated as shown in FIG. 5 using the same procedure as in Example 1.

The back surface insulating layer member 501, back surface side filler material member 502, photovoltaic element (solar cell) 503, and outermost layer member 505 were the same as those in Example 1. The front surface side filler material member 504 was prepared by the same procedure as in Example 1, except that the thickness was changed to 350 μm. A plurality of solar cells were obtained.

The solar cell modules thus obtained were evaluated by the same procedure in Example 1. The results obtained are shown in Table 1.

COMPARATIVE EXAMPLE 2

A plurality of solar cell modules were obtained by the same procedure as in Comparative Example 1, except that the thickness of the outermost layer member 505 was changed to 100 μm.

The solar cell modules thus obtained were evaluated by the same procedure in Example 1. The results obtained are shown in Table 1.

COMPARATIVE EXAMPLE 3

First, there were prepared a back surface insulating layer member 601, a back surface side filler material member 602, a photovoltaic element (solar cell) 603, a glass fiber reinforced member 604, a front surface side filler material member 605, a glass fiber reinforced member 606, and an outermost layer member 607. These members were then laminated as shown in FIG. 6 using the same procedure as in Example 1, to prepare a solar cell module.

The back surface insulating layer member 601, back surface side filler material member 602, photovoltaic element (solar cell) 603, and outermost layer member 607 were the same as those in Example 1. The front surface side filler material member 604 was prepared by the same procedure as in Example 1, except that the thickness was changed to 350 µm. As each of the glass fiber reinforced members 604 and 606, unwoven glass fiber fabric (trademark name: Crane Glass 230, produced by Crane Glass Company) was used. A plurality of solar cell modules were obtained.

The solar cell modules thus obtained were evaluated by the same procedure as in Example 1. The results obtained are shown in Table 1.

As is apparent from Table 1, in the solar cell modules of the present invention, when any external force is applied, the photovoltaic element is stable and the surface coating material is excellent in weatherability, heat resistance, and moisture resistance, without any layer separation; and the photovoltaic element resists deterioration even upon outdoor use for a long period of time, thus achieving a desired photoelectric conversion efficiency.

Specifically, the solar cell module of the present invention comprises a photovoltaic element (solar cell) enclosed by a filler material and a coating material having a three-layered structure which is disposed on the filler material on the light receiving side of the photovoltaic element, where said coating element includes a hard resin layer having a hardness of 50 or more in Shore hardness D; and adhesive layer having the functions of absorbing ultraviolet rays of wavelengths which deteriorate said hard resin layer and of transmitting ultraviolet rays necessary for electric power generation by the photovoltaic element, and also having a layer adhesive function; and an outermost layer of excellent weatherability (the resin itself having excellent stability against heat, light, and moisture), said hard resin layer, adhesive layer, and outermost layer being laminated on the filler material layer in this order. The inventive solar cell module, therefore, can attain the following effects: (1) prevent the photovoltaic element from being damaged by externally applied pressure and hence protecting the solar cell; (2) providing satisfactory weatherability, heat resistance, moisture resistance, and scratch resistance necessary for the solar cell module; (3) ensuring adhesion with the photovoltaic element (solar cell); (4) minimizing deterioration of the photovoltaic element (solar cell) due to moisture permeation; and (5) providing a desired conversion efficiency of the photovoltaic element for a long period of time.

What is claimed is:

1. A solar cell module comprising a photovoltaic element having a photoactive semiconductor layer as a light conversion member, said photovoltaic element being enclosed by a filler material, wherein a three-layered coating material comprising a hard resin layer, an adhesive layer and an outermost layer is laminated in this order over the filler material on the light receiving surface side of said photovoltaic element.

2. A solar cell module according to claim 1, wherein said hard resin layer comprises a resin having a hardness of at least 50 in Shore hardness D.

3. A solar cell module according to claims 1 or 2, wherein said hard resin layer is selected from polycarbonate resin and polyester resin.

4. A solar cell module according to any of claims 1 or 2, wherein the thickness of said hard resin layer is in the range of from 50 to 125 µm.

5. A solar cell module according to any of claims 1 or 2, wherein said adhesive layer comprises a thermoplastic resin containing an ultraviolet absorbent.

6. A solar cell module according to claim 5, wherein said adhesive layer has a total light transmissivity which is at least 90% for light having a wavelength of 400 nm and above; at least 50% for 380 nm, and up to 10% for 350 nm and below.

7. A solar cell module according to claim 5, wherein the thermoplastic resin of said adhesive layer is selected from ethylene-vinyl acetate copolymer (EVA), polyvinyl butyral (PVB), silicone resin, and acrylic resin.

8. A solar cell module according to any of claims 1 or 2, wherein the thickness of said adhesive layer is in the range of from 50 to 200 µm.

9. A solar cell module according to any of claims 1 or 2, wherein said outermost layer comprises a resin having an aqueous contact angle of 70° and above.

10. A solar cell module according to claim 9, wherein said outermost layer comprises a fluororesin.

11. A solar cell module according to any of claims 1 or 2, wherein said semiconductor photoactive layer is an amorphous semiconductor thin film.

12. A solar cell module according to claim 11, wherein said amorphous semiconductor thin film comprises amorphous silicon.

13. A solar cell module according to claim 1, wherein the filler material is selected from the group consisting of ethylene-vinyl acetate copolymer (EVA), polyvinyl butyral (PVB), silicone resin, epoxy resin, and acrylic resin.

TABLE 1

| | scratch test | Hail impact test | adhesive strength in high temperature/high moisture | weatherability appearance | conversion efficiency | durability against temperature change |
|---|---|---|---|---|---|---|
| Example 1 | ○ | ⊚ | ⊚ | ⊚ | 0.99 | ⊚ |
| Example 2 | ○ | ⊚ | ⊚ | ⊚ | 0.98 | ⊚ |
| Example 3 | ○ | ⊚ | ⊚ | ⊚ | 0.99 | ⊚ |
| Example 4 | ○ | ⊚ | ○ | ⊚ | 0.98 | ⊚ |
| Example 5 | ○ | ⊚ | ⊚ | ⊚ | 0.99 | ○ |
| Comparative Example 1 | × | × | ○ | ○ | 0.95 | ○ |
| Comparative Example 2 | ○ | × | ○ | ○ | 0.95 | × |
| Comparative Example 3 | ○ | ○ | ○ | ○ | 0.96 | ○ |

14. A solar cell module according to claim 1, wherein the filler material contains one or more materials selected from the group consisting of a crosslinking agent, an antioxidant, and an ultraviolet absorbent.

15. A solar cell module according to claim 1, wherein the photovoltaic element comprises a substrate, an aluminum layer disposed on said substrate, a zinc oxide layer disposed on said aluminum layer, a photoactive semiconductor layer disposed on said zinc oxide layer, and a transparent conductive layer disposed on said photoactive semiconductor layer.

16. A solar cell module according to claim 15, wherein the photoactive semiconductor layer comprises a laminate of an n-type semiconductor layer, an i-type semiconductor layer, and a p-type semiconductor layer.

17. A solar cell module according to claim 16, wherein the p-type semiconductor layer contains a microcrystalline silicon material.

18. A solar cell module according to claim 16, wherein the i-type semiconductor layer contains an amorphous silicon material.

19. A solar cell module according to claim 16, wherein the n-type semiconductor layer contains an amorphous silicon material.

20. A solar cell module according to claim 15, wherein the photoactive semiconductor layer comprises a plurality of stacked bodies, each comprising a laminate of an n-type semiconductor layer, an i-type semiconductor layer, and a p-type semiconductor layer.

21. A solar cell module according to claim 20, wherein the p-type semiconductor layer contains a microcrystalline silicon material.

22. A solar cell module according to claim 20, wherein the i-type semiconductor layer contains an amorphous silicon material.

23. A solar cell module according to claim 20, wherein the n-type semiconductor layer contains an amorphous silicon material.

24. A solar cell module according to claim 15, wherein the photoactive semiconductor layer comprises two stacked bodies each comprising a laminate of an n-type semiconductor layer, an i-type semiconductor layer, and a p-type semiconductor layer.

25. A solar cell module according to claim 24, wherein the p-type semiconductor layer contains a microcrystalline silicon material.

26. A solar cell module according to claim 24, herein the i-type semiconductor layer contains an amorphous silicon material.

27. A solar cell module according to claim 24, wherein the n-type semiconductor layer contains an amorphous silicon material.

28. A solar cell module according to claim 15, wherein a collecting electrode is disposed on the transparent conductive layer.

29. A solar cell module according to claim 1, which further comprises an insulating member disposed on a side of the photovoltaic element opposite the light receiving surface side.

30. A solar cell module according to claim 29, wherein the insulating member is a film of nylon, polyethylene, polyester, or polystyrene.

* * * * *

UNITED STATES PATENT AND TRADEMARK OFFICE
CERTIFICATE OF CORRECTION

PATENT NO. : 5,650,019

DATED : July 22, 1997

INVENTOR(S): Satoru Yamada, et al

It is certified that error appears in the above-identified patent and that said Letters Patent is hereby corrected as shown below:

ON THE TITLE PAGE [57] IN THE ABSTRACT
  line 7, "adhesive" should read --an adhesive--;
  line 13, "moisture," should read --moisture),--.

COLUMN 3
  line 8, "material" should read --and--;
  line 28, "similarly" should read --similar--.

COLUMN 8
  line 21, "electrically connected" should be deleted.

COLUMN 9
  line 12, "A1" should read --Al--;
  line 17, "Å)i-layer" should read --Å)/i-layer--;
  line 18, "Å/p-layer" should read --Å)/p-layer--;
  line 19, "Å/i-layer" should read --Å)/i-layer--; and "Å/p-layer" should read --Å)/p-layer--;
  line 42 "ont he" should read --on the--;
  line 46, "elements" should read --element--;
  line 51, "D," should read --D)--.

COLUMN 10
  line 58, "Hail" should read --hail--.

UNITED STATES PATENT AND TRADEMARK OFFICE
CERTIFICATE OF CORRECTION

PATENT NO. : 5,650,019

DATED : July 22, 1997

INVENTOR(S) : Satoru Yamada, et al

It is certified that error appears in the above-identified patent and that said Letters Patent is hereby corrected as shown below:

COLUMN 11
line 47, ", a mark ○ indicates the case where a" should be deleted;
line 48, "slight appearance change is observed" should be deleted.

COLUMN 13
line 8, "were" should read --was--;
line 26, "adhesive" should read --an adhesive--;
Table 1, "Hail" should read --hail--.

COLUMN 14
line 24, "above;" should read --above,--.

UNITED STATES PATENT AND TRADEMARK OFFICE
CERTIFICATE OF CORRECTION

PATENT NO. : 5,650,019

DATED : July 22, 1997

INVENTOR(S): Satoru Yamada, et al

It is certified that error appears in the above-identified patent and that said Letters Patent is hereby corrected as shown below:

COLUMN 16
  line 15, "herein" should read --wherein--.

Signed and Sealed this

Twenty-first Day of April, 1998

Attest:

BRUCE LEHMAN

Attesting Officer          Commissioner of Patents and Trademarks